United States Patent
Honda

(10) Patent No.: US 7,616,290 B2
(45) Date of Patent: Nov. 10, 2009

(54) EXPOSURE APPARATUS AND METHOD

(75) Inventor: Tokuyuki Honda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 284 days.

(21) Appl. No.: 11/413,147

(22) Filed: Apr. 28, 2006

(65) Prior Publication Data

US 2006/0256308 A1  Nov. 16, 2006

(30) Foreign Application Priority Data

May 11, 2005 (JP) ............................. 2005-138948

(51) Int. Cl.
*G03B 27/42* (2006.01)
(52) U.S. Cl. ............................. 355/53; 356/128; 438/7
(58) Field of Classification Search .................. 355/53; 438/7; 356/128
See application file for complete search history.

(56) References Cited

U.S. PATENT DOCUMENTS

| | | | | |
|---|---|---|---|---|
| 5,610,683 | A * | 3/1997 | Takahashi | 355/53 |
| 6,104,511 | A * | 8/2000 | Hesselink et al. | 359/22 |
| 6,317,195 | B1 * | 11/2001 | Taniguchi | 355/53 |
| 6,426,045 | B1 * | 7/2002 | Jeng et al. | 422/82.05 |
| 6,661,522 | B2 * | 12/2003 | Ouchi | 356/515 |
| 6,844,206 | B1 * | 1/2005 | Phan et al. | 438/7 |
| 2002/0163629 | A1 * | 11/2002 | Switkes et al. | 355/53 |
| 2005/0018208 | A1 * | 1/2005 | Levinson | 356/517 |
| 2005/0046813 | A1 * | 3/2005 | Streefkerk et al. | 355/30 |
| 2006/0170889 | A1 | 8/2006 | Honda | 355/53 |
| 2006/0256308 | A1 | 11/2006 | Honda | 355/53 |

FOREIGN PATENT DOCUMENTS

| | | | |
|---|---|---|---|
| EP | 1524558 A1 * | 4/2005 | |
| JP | 10-340846 | 12/1998 | |
| JP | 2004-301825 | 10/2004 | |
| WO | WO 2005/048328 A1 | 5/2005 | |
| WO | WO 2005/062351 A1 | 7/2005 | |

* cited by examiner

*Primary Examiner*—Diane I Lee
*Assistant Examiner*—Steven H Whitesell-Gordon
(74) *Attorney, Agent, or Firm*—Fitzpatrick, Cella, Harper & Scinto

(57) ABSTRACT

An exposure apparatus including a projection optical system for projecting a pattern of a reticle onto a plate to be exposed, via a liquid that is filled in a space between the projection optical system and the plate, a supply pipe for supplying the liquid to the space between a final surface in the projection optical system and the plate, a recovery pipe for recovering the liquid from the space between the final surface in the projection optical system and the plate, and a measuring apparatus for measuring a refractive index of the liquid. The measuring apparatus includes (i) a cell for accommodating the liquid and transmitting light, wherein the cell is connected to one of the supply pipe and the recovery pipe, and (ii) a detector for detecting an incident position of the light refracted by the liquid in the cell.

4 Claims, 8 Drawing Sheets

EXPOSURE APPARATUS AND METHOD

This application claims foreign priority benefit based on Japanese Patent Application No. 2005-138948, filed on May 11, 2005, which is hereby incorporated by reference herein in its entirety as if fully set forth herein.

BACKGROUND OF THE INVENTION

The present invention relates, generally, to an exposure apparatus, and, more particularly, to an immersion type exposure apparatus that fills a space between a final surface in a projection optical system and a surface in a plate to be exposed with a liquid, and exposes the plate via the projection optical system and the liquid.

A projection exposure apparatus has conventionally been used to transfer a circuit pattern on a reticle (or a mask) via a projection optical system onto a wafer, etc., and high-quality exposure at a high resolution has recently been increasingly demanded. The immersion type exposure has attracted attention as one means that satisfies this demand. The immersion type exposure promotes a higher numerical aperture ("NA") of the projection optical system by replacing a medium (typically, air) at the wafer side of the projection optical system with a liquid. The projection optical system has an NA=n·sin θ, where n is a refractive index of the medium, and the NA increases when the medium that has a refractive index higher than the refractive index of air, i.e., n>1. As a result, the resolution R ($R = k_1(\lambda/NA)$) of the exposure apparatus defined by a process constant $k_1$ and a light source wavelength $\lambda$ becomes small.

However, if the refractive index of the liquid (immersion liquid) is changed with time by a change of a temperature or component, an aberration, such as a focal error, a spherical aberration, and a curvature of field, occurs and an imaging performance of the projection optical system deteriorates. The exposure apparatus needs to precisely transfer a reticle pattern onto a wafer, and due to the recent demands for finer processing to the semiconductor devices, the transferred pattern becomes more sensitive to the aberration of the optical system. In particular, due to further higher NA's of the projection optical system, an aqueous solution and an organic material investigated as an adoption to the liquid have provided a large change of the refractive index.

Then, an immersion type exposure apparatus that includes an adjusting part for adjusting the refractive index of the liquid has been proposed. See, for example, Japanese Patent Applications, Publication Nos. 10-340846 and 2004-301825.

However, Japanese Patent Application, Publication No. 10-340846, measures the aberration of the projection optical system, calculates a change amount of the refractive index based on the result and adjusts the refractive index. The measurement of the aberration needs a long time. Then, when the refractive index is changed, Japanese Patent Application, Publication No. 10-340846, cannot quickly adjust this. Therefore, it is not preferable to use the aberration measuring apparatus of the projection optical system to correct the change of the refractive index of the liquid. In addition, a correspondence with the aberration and the refractive index is not clear. Japanese Patent Application, Publication No. 2004-301825, projects plural detected light beams onto a substrate with a different degree of an incident angle and obtains a change amount of the refractive index based on a difference of an error amount at a surface position. Therefore, if the refractive index of the liquid is changed by a factor of both the temperature and the component, a refractive index with a high precision is not obtained.

BRIEF SUMMARY OF THE INVENTION

Accordingly, the present invention is directed to an exposure apparatus that includes a measuring apparatus that quickly measures a change of a refractive index of a liquid with high precision.

An exposure apparatus according to one aspect of the present invention includes a projection optical system for projecting a pattern of a reticle onto a plate to be exposed, via a liquid that is filled in a space between the projection optical system and the plate, and a measuring apparatus for measuring a refractive index of the liquid, wherein the measuring apparatus includes a cell for accommodating the liquid and transmitting light, and a detector for detecting an incident position of the light refracted by the liquid in the cell.

An exposure method according to another aspect of the present invention includes the steps of calculating a change of a refractive index of light using the above exposure apparatus, adjusting at least one of a projection optical system and a liquid based on a calculated change of the refractive index, and exposing a plate using the projection optical system and the liquid, after the adjusting step.

A device fabricating method according to still another aspect of the present invention includes the steps of exposing an object to be exposed using the above exposure apparatus, and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENT

Figure 1:
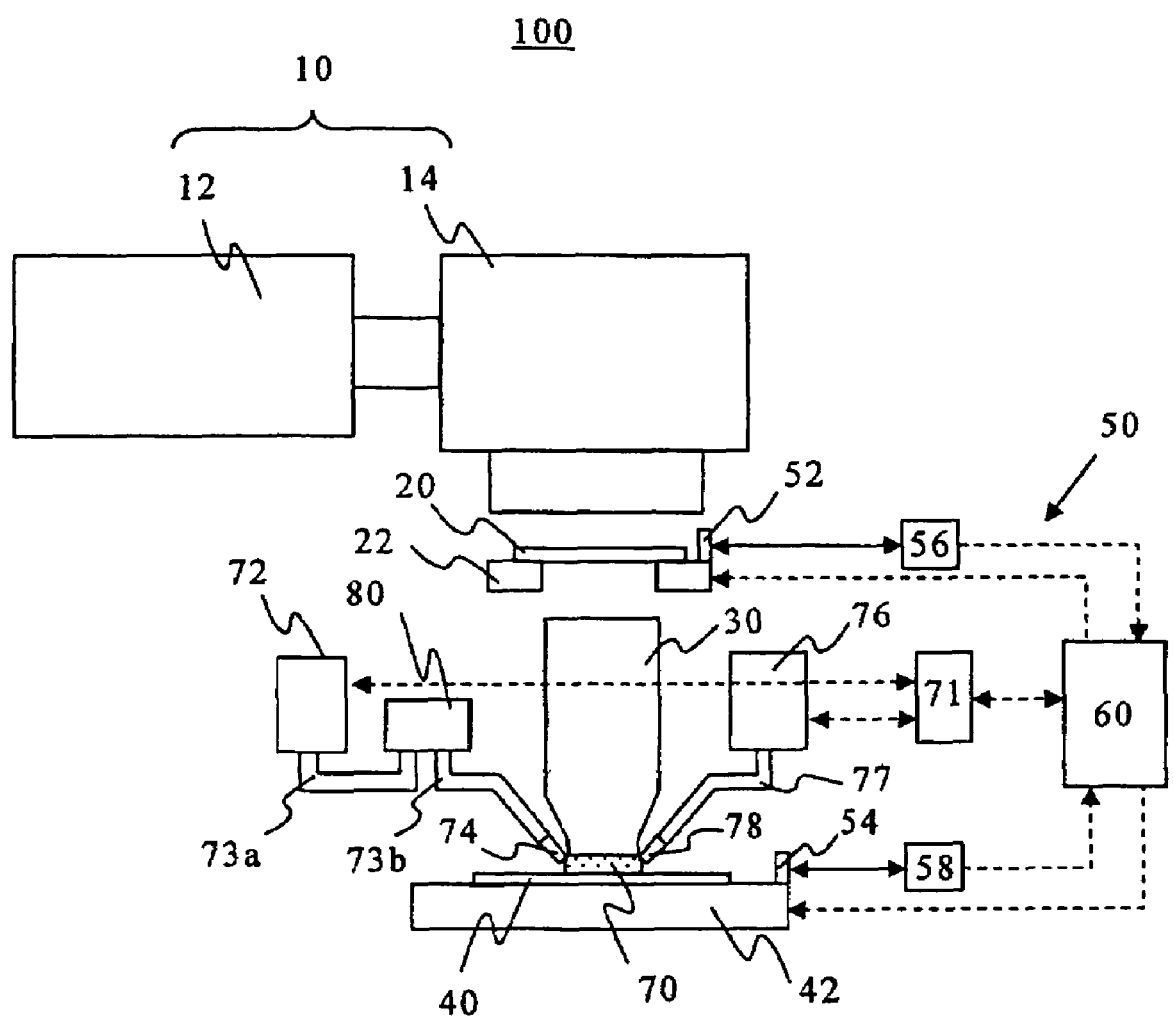
FIG. 1 is a schematic sectional view of an exposure apparatus of one aspect according to the present invention.

With reference to the accompanying drawings, a description will be given of an exposure apparatus 100 of one aspect according to the present invention. Here, FIG. 1 is a schematic sectional view of the exposure apparatus 100. The exposure apparatus 100 is an immersion type exposure apparatus that exposes a circuit pattern of a reticle 20 onto a plate 40 to be exposed via a liquid (immersion liquid) 70 supplied to a space between a final surface (final optical element) at the plate 40 side in a projection optical system 30 and the plate 40. The exposure apparatus 100 uses a step-and-scan manner or a step-and-repeat manner. Such an exposure apparatus is suitable for a sub-micron or a quarter-micron lithography process. The instant embodiment exemplarily describes a step-and-scan manner exposure apparatus (which is also called a "scanner").

The exposure apparatus 100 includes an illumination optical system 10, a reticle stage 22 that mounts the reticle 20, the projection optical system 30, a wafer stage 42 that mounts the plate 40, a distance measuring part 50, a stage controller 60, a liquid supply-recovery system, and a measuring apparatus 80.

The illumination apparatus 10 illuminates the reticle 20, on which a circuit pattern to be transferred is formed, and includes a light source section 12 and an illumination optical system 14.

The light source section 12 uses, in the instant embodiment, a light source, such as an ArF excimer laser with a wavelength of approximately 193 [nm]. However, the light source section 12 is not limited to an ArF excimer laser because, for example, a KrF excimer laser with a wavelength of approximately 248 [nm] or an $F_2$ laser with a wavelength of approximately 157 [nm] may be used. The kind and the number of the lasers are not limited. Similarly, the kind of the light source section 12 is not limited. A beam shaping system can use, for example, a beam expander, etc., with a plurality of cylindrical lenses. The beam shaping system converts an aspect ratio of a size of a sectional shape of a parallel beam from the laser into a desired value (for example, by changing the sectional shape from a rectangle to a square), and reshapes the beam shape to a desired one.

The illumination optical system 14 is an optical system that illuminates the reticle 20, and includes a lens, a mirror, an optical integrator, a stop, and the like, for example, a condenser lens, an optical integrator (a fly-eye lens), an aperture stop, a condenser lens, a slit, and an image-forming optical system, in this order. The optical integrator may include a fly-eye lens or an integrator formed by stacking two sets of cylindrical lens array plates (or lenticular lenses), and can be replaced with an optical rod or a diffractive element.

The reticle 20 is transported by a reticle transport system (not shown) from an outside of the exposure apparatus 100, and is supported and driven by the reticle stage 22. The reticle 20 is made, for example, of quartz, and forms the circuit pattern to be transferred. Diffracted light from the pattern of the reticle 20 passes through the projection optical system 30 and is then projected onto the plate 40. The reticle 20 and the plate 40 are located in an optically conjugate relationship. Since the exposure apparatus 100 is a scanner, the reticle 20 and the plate 40 are scanned at the speed ratio of the reduction ratio of the projection optical system 30, thus transferring the pattern from the reticle 20 to the plate 40. If a step-and-repeat manner exposure apparatus (referred to as a "stepper") is used, the reticle 20 and the plate 40 remain still when exposing the reticle pattern.

The reticle 20 includes not only a mask that has a fixed pattern, but pattern generation devices, such as a deformable mirror.

The reticle stage 22 is attached to a stool (not shown). The reticle stage 22 supports the reticle 20 via a reticle chuck (not shown), and is controlled by a moving mechanism (not shown) and the stage controller 60. The moving mechanism includes a linear motor, etc., and moves the reticle 20 by driving the reticle stage 22 in the X-axis direction.

The projection optical system 30 images the diffracted light passing through the pattern of the reticle 20 onto the plate 40. The projection optical system 30 may use an optical system comprised solely of a plurality of lens elements, an optical system including a plurality of lens elements and at least one concave mirror (a catadioptric optical system). Any necessary correction of the chromatic aberration is available through a plurality of lens units made from glass materials having different dispersion values (Abbe values), or by arranging a diffractive optical element, such that it disperses in a direction opposite to that of the lens unit.

The plate 40 is transported by a wafer transport system (not shown) from outside of the exposure apparatus 100, and is supported and driven by the wafer stage 42. The plate 40 is, in the instant embodiment, a wafer, which includes a glass plate for the liquid crystal substrate and other objects. A photoresist is applied to the plate 40.

The wafer stage 42 supports the plate 40 via a wafer chuck (not shown). The wafer stage 42 serves to adjust a position in the vertical or longitudinal direction, a rotational direction and an inclination of the plate 40, under control of the stage controller 60. During exposure, the stage controller 60 controls the wafer stage 42 so that the surface of the plate 40 (exposure area) always accords with the imaging plane of the projection optical system 30 with high precision.

The distance measuring part 50 measures a position of the reticle stage 22, a two-dimensional position of the wafer stage 42 on a real-time basis, via reference mirrors 52 and 54, and laser interferometers 56 and 58. The distance measurement result by the distance measuring part 50 is transmitted to the stage controller 60, and the reticle stage 22 and the wafer stage 42 are driven at a constant speed ratio under control of the stage controller 60 for positioning and synchronous control.

The stage controller 60 controls the drive of the reticle stage 22 and the wafer stage 42.

The liquid supply-recovery system supplies the liquid 70 into the space between the projection optical system 30 and the plate 40, and recovers the supplied liquid 70. The liquid supply-recovery system includes an immersion controller 71, a liquid supply part 72, supply pipes 73a and 73b, a liquid supply port 74, a liquid recovery part 76, a liquid recovery pipe 77, and a liquid recovery port 78.

The immersion controller 71 obtains information of the wafer stage 42, such as a current position, a speed acceleration, a target position, and a moving direction, and controls the immersion exposure based on the information. The immersion controller 71 provides the liquid supply part 72 and the liquid recovery part 76 with control commands, such as a switch between supplying and recovering of the liquid 70, a stop of the supply of the liquid 70, a stop of the recovery of the liquid 70, and control over the amounts of the supplied or recovered liquid 70.

The liquid supply part 72 includes a generating part (not shown in FIG. 1), a degas part (not shown in FIG. 1), and a temperature controller (not shown in FIG. 1). The liquid supply part 72 supplies the liquid 70 via the supply pipe 73b arranged around the final surface in the projection optical system 30, and forms a liquid film of the liquid 70 in the space between the projection optical system 30 and the plate 40. The space between the projection optical system and the plate 40 preferably has a thickness, for example, of 1.0 mm, enough to stably form and remove the liquid film of the liquid 70.

The liquid 70 serves to improve the resolution in the exposure by shortening the equivalent exposure wavelength of the exposure light from the light source section 12. The liquid 70 has a high light transmission characteristic and refraction index characteristic to the wavelength of the exposure light, and is chemically stable to the photoresist applied to the plate 40 and the final surface in the projection optical system 30. Moreover, the liquid 70 is selected from materials that do not contaminate the projection optical system 30 and matches the resist process. The liquid 70 is, for example, pure water, an aqueous solution, an organic material, a function water, liquid fluorides (for example, a fluorocarbon), or a high refractive index material (for example, an alkaline earth oxide, such as MgO, CaO, SrO and BaO). The liquid 70 is selected according to the resist coated on the plate 40 and the wavelength of the exposure light.

When a $Cs_2So_4$ or $H_3PO_4$ aqueous solution or the organic material (for example, Glycerol or n-Decane), which has a high refractive index to the light with a wavelength of 193 nm, is used as the liquid 70, an NA of the projection optical system 30 becomes higher, and a high resolution can be achieved. In this case, the refractive index of the aqueous solution is easily changed by a change of a concentration of a solute. Since a temperature dependence of the refractive index of the organic material is generally large as compared with water, the refractive index is easily changed by a change of the temperature. However, as described later, the instant embodiment can measure and correct the change of the refractive index with high precision and quickly, and can stabilize exposure performance.

The generating part reduces contaminants, such as metal ions, fine particles, and organic matter, from material water supplied from a material water source (not shown), and generates the liquid 70. The liquid 70 generated by the generating mechanism is supplied to the degas part. The degas part reduces dissolved oxygen and nitrogen in the liquid 70 by adding degas processing. The degas part includes, for example, a film module and a vacuum pump. The degas part preferably has a degas performance (about 9 ppm) and a situation state of the dissolved nitrogen (about 14 ppm) in the liquid 70. The temperature controller controls the liquid 70 to a predetermined temperature (for example, 23° C.).

The supply pipe 73a supplies the liquid 70 given the degas process and temperature control by the degas part and temperature controller to the measuring apparatus 80, and supplies the liquid 70 passed through the measuring apparatus 80 to the space between the projection optical system and the plate 40 via the liquid supply port 74.

The liquid recovery part 76 recovers the liquid 70 supplied to the space between the final surface in the projection optical system 30 and the plate 40 via the recovery pipe 77. The recovery part includes, for example, a tank that temporarily stores the recovered liquid 70 by supplying the recovered liquid 70 to the liquid supply part 72.

The measuring apparatus 80 measures the change of the refractive index of the liquid 70. The measuring apparatus 80 is provided at the liquid supply side in the instant embodiment, and may be provided at the liquid recovery side, for example, a space between the liquid recovery port 78 and the liquid recovery part 76. If the measuring apparatus 80 is provided at the liquid supply side, the measuring apparatus 80 can measure the change of the refractive index of the liquid 70 between lots. If the liquid 70 circulates from the liquid recovery part 76 to the liquid supply part 72, the same effect as the case that the measuring apparatus 80 is provided at the liquid recovery side can be obtained. If the measuring apparatus 80 is provided at the liquid recovery side, the measuring apparatus 80 can measure the change of the refractive index when the liquid 70 is contaminated by the resist and the concentration changes, or when the liquid 70 is warmed by the exposure light and the temperature changes.

Figure 5:
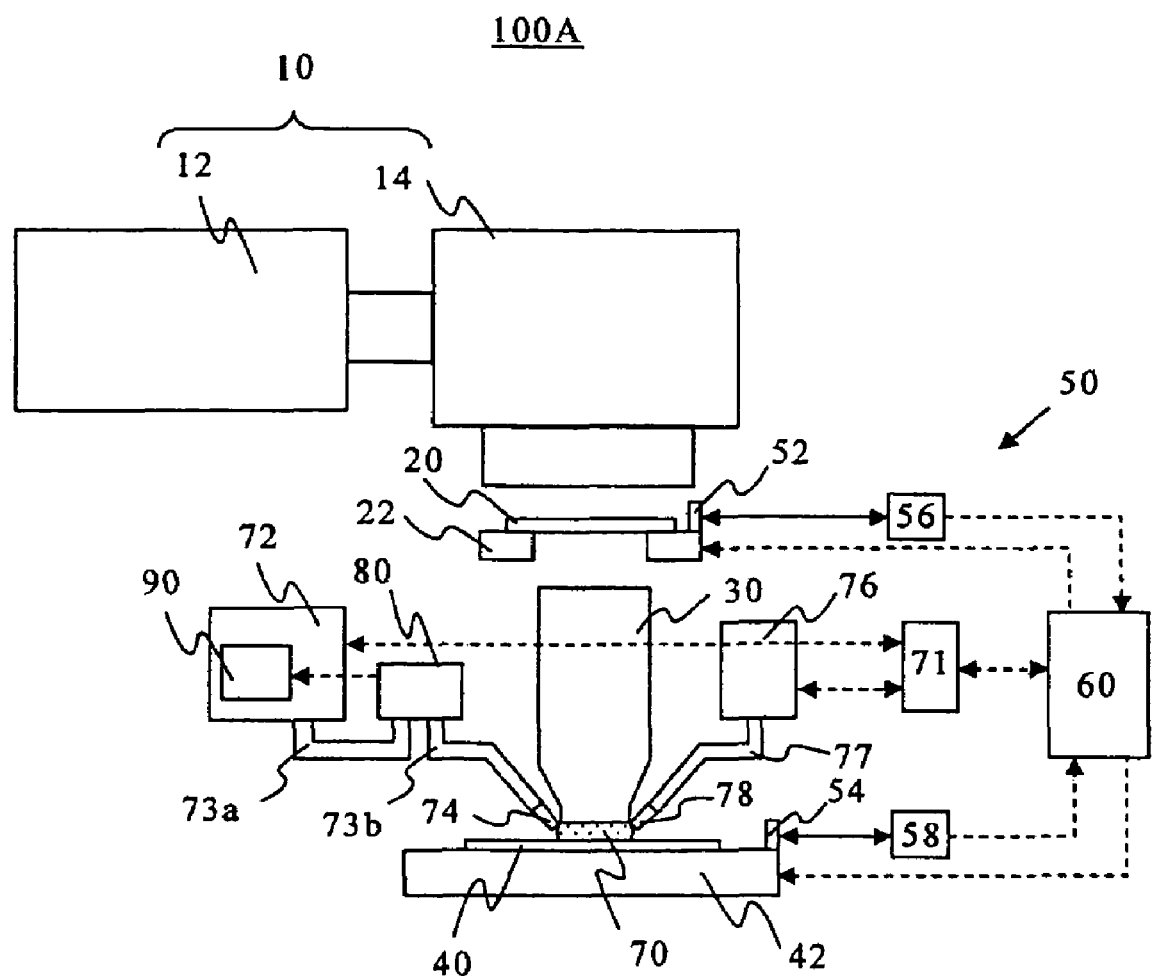
FIG. 5 is a schematic sectional view of a measuring apparatus of the exposure apparatus shown in FIG. 1, which includes a temperature controller that corrects a change of a refractive index.
Figure 6:
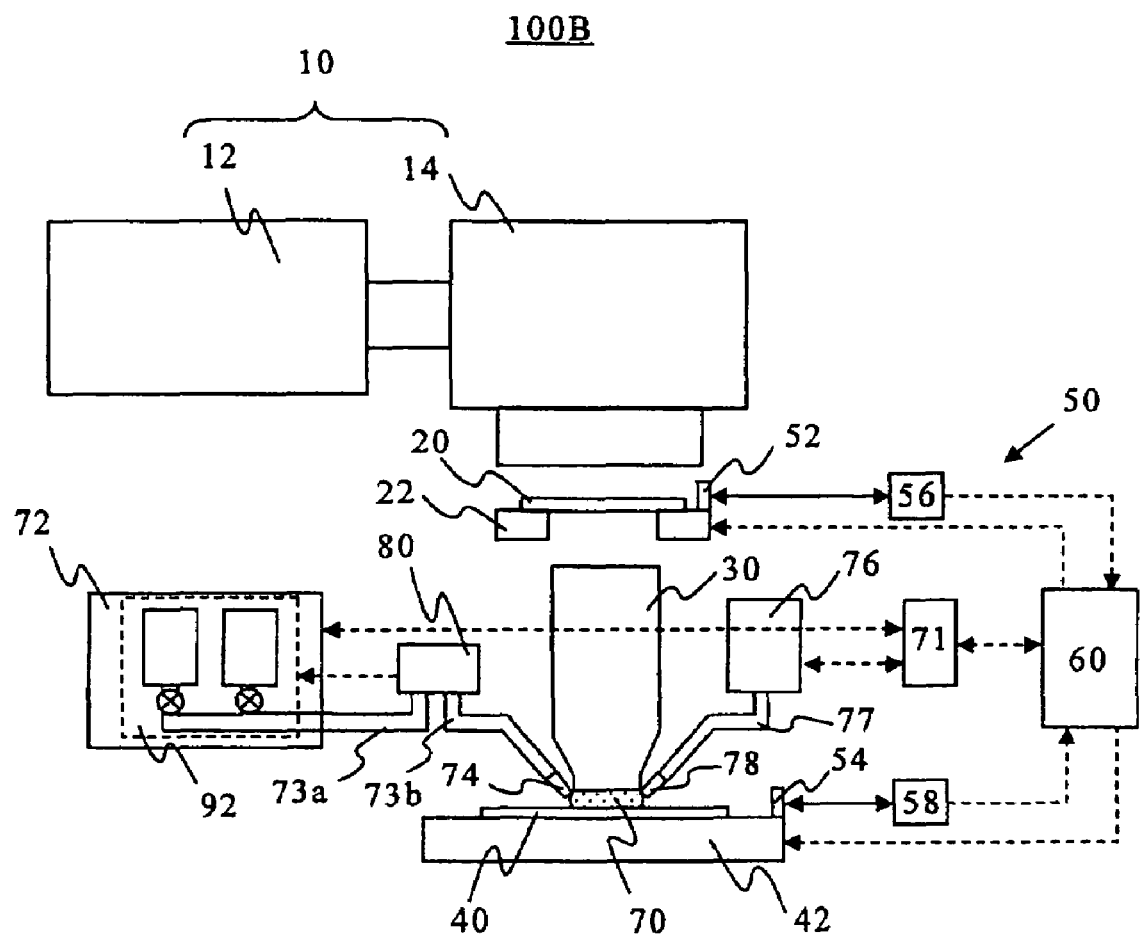
FIG. 6 is a schematic sectional view of a measuring apparatus of the exposure apparatus shown in FIG. 1, which includes a concentration controller that corrects a change of a refractive index.
Figure 7:
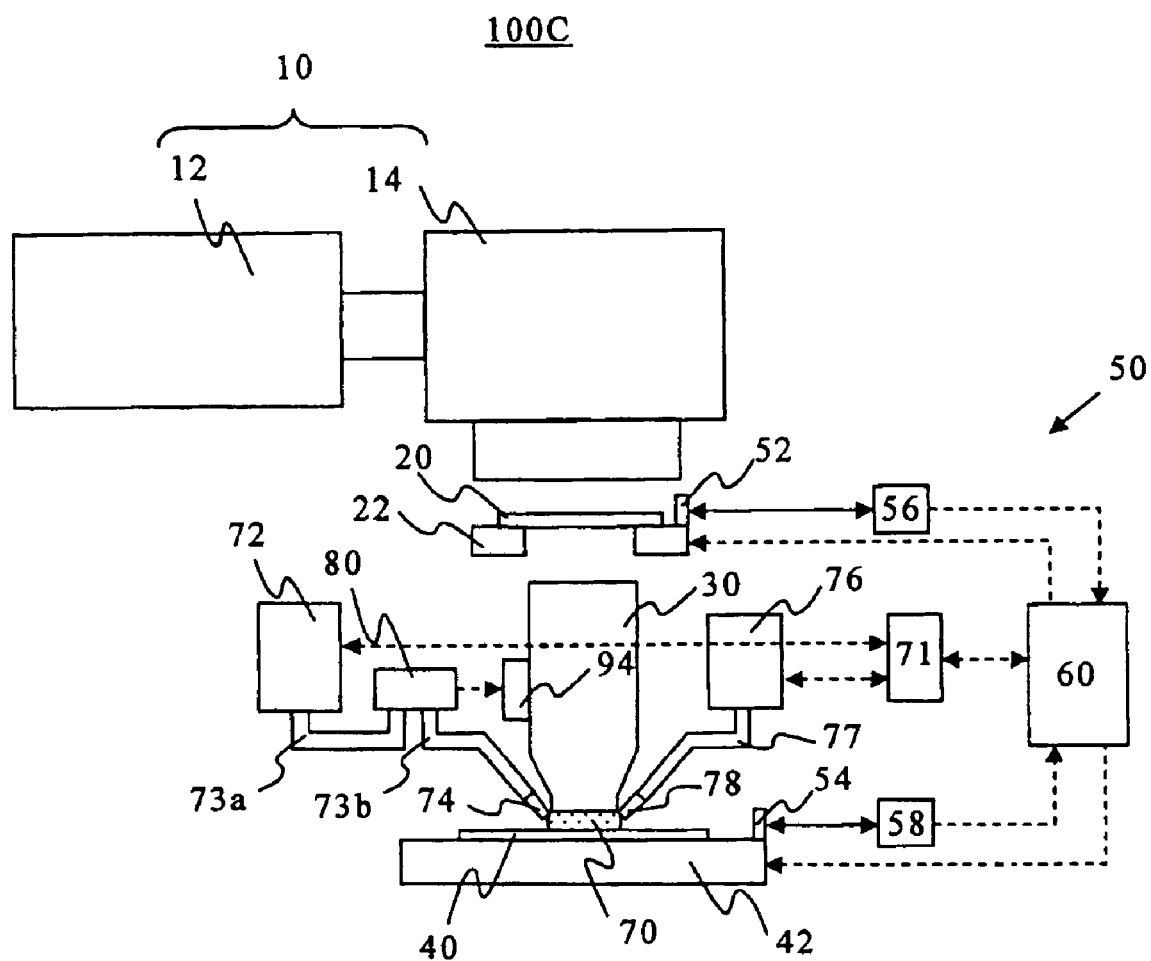
FIG. 7 is a schematic sectional view of a measuring apparatus of the exposure apparatus shown in FIG. 1, which includes an aberration controller of a projection optical system that corrects a change of a refractive index.

In the instant embodiment, when the refractive index of the liquid 70 changes, the aberration is not measured. Therefore, information of the change of the refractive index (and an aberration information obtained from it) is obtained in real time, and this can be quickly corrected without greatly reducing a throughput. If the change of the refractive index is larger than a predetermined range, a user is notified of an error, or a refractive index correcting part shown in FIGS. 5 to 7 is started.

Figure 2:
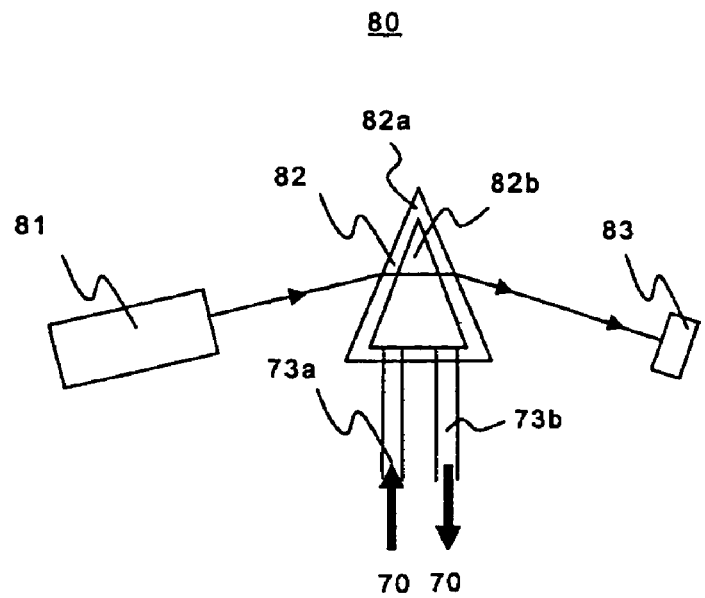
FIG. 2 is a schematic sectional view of a measuring apparatus of the exposure apparatus shown in FIG. 1.

FIG. 2 is a schematic sectional view of the measuring apparatus 80. In FIG. 2, the measuring apparatus 80 includes a light source 81, a cell 82, and a detector 83. The light source 81 is a mercury lamp, a semiconductor laser, a solid laser, a gas laser, etc., and light from the light source 81 enters the cell 82.

The cell 82 has a prism shape that includes an accommodating part 82b for accommodating the liquid 70, and a base member 82a is made a transparent material to the wavelength of the light source (for example, quartz glass). The liquid 70 is supplied to the accommodating part 82 via the supply pipe 73a. In an inside of the cell 82, an incident surface to the liquid 70 and an excited surface are non-parallel and from a predetermined angle (for example, sixty degrees). The light refracted by the cell 82 enters the detector 83.

The detector 83 preferably sensitively changes an output according to an incident position of a ray, and may use, for example, a split detector. An electrical signal according to the incident position can be obtained by combining the split detector and a differential amplifier. Instead of the split detector, a differential signal is compoundable digitally from each output of the split detector. The detector 83 may use a position sensitive detector. Moreover, an equivalence function of the split detector can be achieved by combining a beam splitter and a plural light detector.

In the structure shown in FIG. 2, if a refractive index of an immersion liquid changes, a refracting angle of the cell 82 changes. Then, the incident angle of the ray to the detector 83 changes, and the output of the light detector changes. Therefore, the change of the refractive index can be measured by the output of the light detector.

Figure 3:
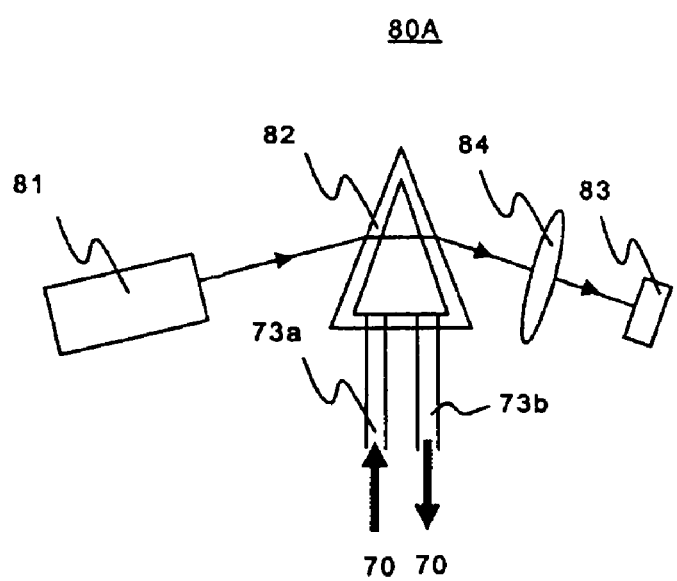
FIG. 3 is a schematic sectional view of an example of the measuring apparatus shown in FIG. 2.

FIG. 3 is a schematic sectional view of a measuring apparatus 80A as an example of the measuring apparatus 80. The measuring apparatus 80A is different from the measuring apparatus 80 in that an optical Fourier transforming element 84 is provided between the cell 82 and the detector 83. The Fourier transforming element 84 is, for example, a lens, and the cell may be provided near a front focal plane of the lens and the detector 83 may be provided near a back focal plane of the lens. Moreover, an optical element that has a function of a Fourier transforming equivalent to the lens (for example, a concave mirror or a diffraction optical element) may be used as the Fourier transforming element 84.

The measuring apparatus 80A can transform the change of the refracting angle of the light into a change of the incident position detected by the detector 83 by the optical Fourier transforming function. Thereby, even if a distance between the cell 82 and the detector 83 is comparatively short, the change of the refractive index can be measured with high sensitivity. An arrangement of the measuring apparatus 80A to the inside exposure apparatus 100 becomes easy, and the measuring apparatus 80A cannot be easily influenced by a change of atmosphere by shortening the distance between the cell 82 and the detector 83. Generally, a heat source, such as the stage, exists, in the inside of the exposure apparatus 100.

Therefore, it is important for the improvement of the measurement precision to reduce (or to prevent) the influence of the change of the atmosphere.

The change of the refractive index can be measured and corrected with high precision by closing the wavelength of measured light used for the measurement of the refractive index to the wavelength of the exposure light when plural factors of the change of the refractive index exists or when the liquid of a different kind is used. Of course, the same light source as an exposure light source 110 may be used as the light source 81. If the same light source is used, a cost of the apparatus can be reduced.

Figure 4:
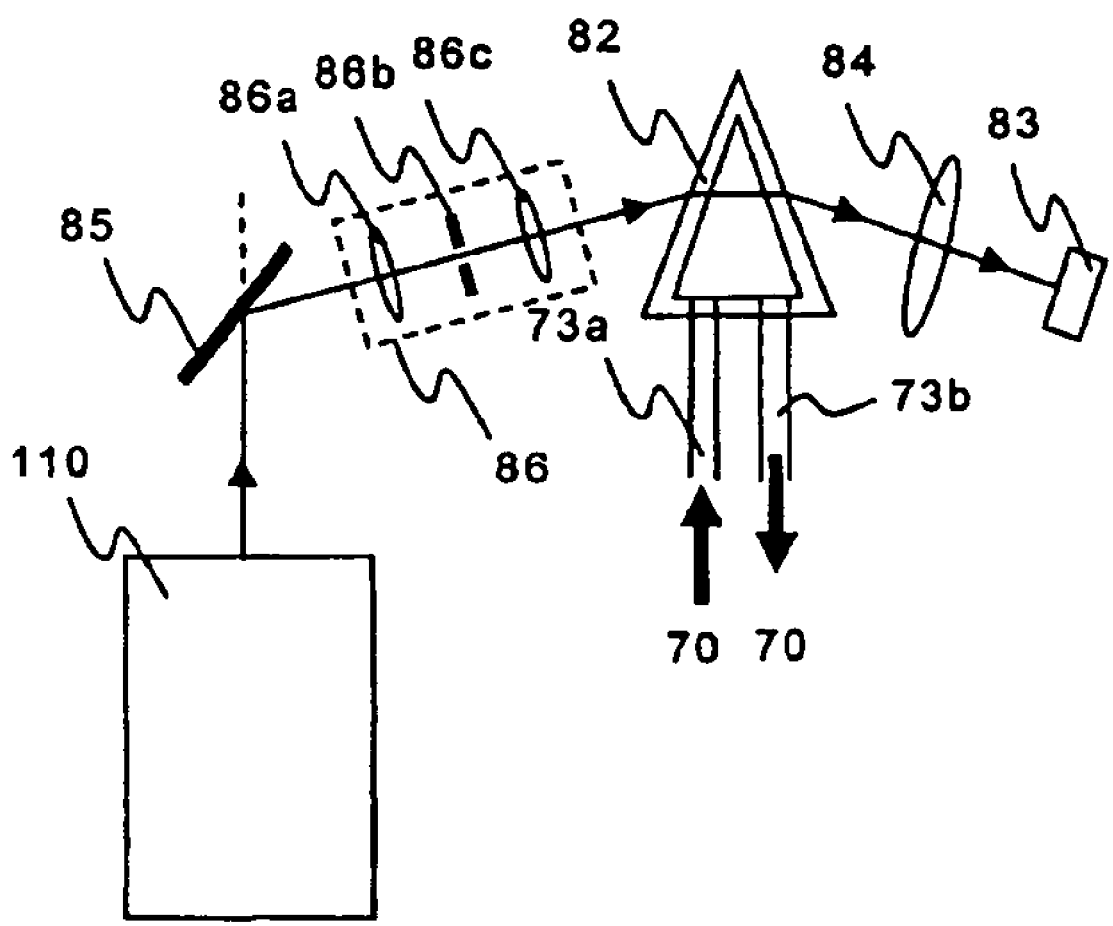
FIG. 4 is a schematic sectional view of another example of the measuring apparatus shown in FIG. 2.

FIG. 4 is a schematic sectional view of a measuring apparatus 80B using the exposure light source 110. A beam splitter 85 splits the light from the exposure light source 110, and one of these enters the cell 82. A spatial filter is provided in an optical path between the exposure light source 110 and the cell 82. The spatial filter 86 includes, for example, a condenser lens 86a, a pinhole 86b, and a collimator lens 86c. The condenser lens 86a and the collimator lens 86c may be replaced by the concave mirror and the diffraction optical element. The light refracted by the cell 82 enters the detector 83 via the optical Fourier transforming element 84.

The measuring apparatus 80B can measure and correct the change of the refractive index with high precision when plural factors of the change of the refractive index exists or when the liquid of a different kind is used. In addition, the measuring apparatus 80B can measure the change of the refractive index with high sensitivity when the exposure light source 110, such as the mercury lamp or excimer laser, which has an inadequate spatial coherence, is used.

FIG. 5 is a schematic sectional view of an exposure apparatus 100A that includes a temperature controller 90 that corrects the refractive index. The exposure apparatus 100A is different from the exposure apparatus 100 in that the liquid supply part 72 includes the temperature controller 90 and the output of the measuring apparatus 80 electrically feeds back to the temperature controller 90. The temperature controller 90 may be provided inside of the liquid supply part 72. The temperature controller 90 controls the temperature of the liquid 70 so that the change of the refractive index is canceled. A control apparatus for controlling temperature is easily realizable by well-known technology. For example, a wall surface of the cell of the liquid 70 may be cooled and heated using a Peltier element.

FIG. 6 is a schematic sectional view of an exposure apparatus 100B that includes a concentration controller 92 that corrects the refractive index. The exposure apparatus 100B is different from the exposure apparatus 100 in that the liquid supply part 72 includes the concentration controller 92 and the output of the measuring apparatus 80 electrically feeds back to the concentration controller 92. The concentration controller 92 is a mixer that includes, for example, plural liquid containers, a pipe that connects with these plural containers, and a valve that adjusts a flow rate from each container. The concentration controller 92 controls the concentration of the liquid 70 so that the change of the refractive index is canceled.

FIG. 7 is a schematic sectional view of an exposure apparatus 100C that includes an aberration controller 94 of the projection optical system 30 that corrects the refractive index. The exposure apparatus 100C is different from the exposure apparatus 100 in that the projection optical system 30 includes a correction mechanism (not shown) and the aberration controller 94 that electrically connects with the correction mechanism and the output of the measuring apparatus 80 feeds back to the aberration controller 94. The correction mechanism of the projection optical system may adjust, for example, a position of one or plural lenses by a mechanical actuator. In other words, the correction mechanism can move plural lenses (not shown) included in the projection optical system 30 in an optical axis direction and/or in a direction perpendicular to the optical axis. A driving system for the aberration adjustment drives plural lenses based on the aberration information obtained by the measuring apparatus 80. Thereby, the aberration of one or plural values of the projection optical system (particularly, Seidel's five aberrations) can be corrected and optimized. The correction mechanism of the projection optical system 30 can apply various well-known systems, such as a movable mirror (when the optical system is a catadioptric optical system or mirror system), an inclinable parallel plate, a pressure controllable space, and a surface correction by the actuator. When the projection optical system 30 is a catadioptric system, the correction mechanism may use a deformable mirror. Moreover, a temperature distribution of the lens may be controlled by heating one or plural lenses. The aberration controller 94 adjusts the projection optical system 30 so that the change of the refractive index is canceled.

In exposure, the illumination optical system 14 illuminates the reticle 20 using the light emitted from the light source section 12. The light that passes the reticle 20 and reflects the reticle pattern is imaged on the plate 40 by the projection optical system 30 via the liquid 70. The measuring apparatus 80 measures the change of the refractive index of the liquid 70, and the temperature or concentration of the liquid 70 is controlled or the aberration of the projection optical system 30 is adjusted so that the change is cancelled. Therefore, the exposure apparatus 100 prevents the deterioration of the exposed pattern caused by the change of the refractive index of the liquid 70, and can expose the pattern of the reticle 20 onto the plate 40 with high resolution.

Figure 8:
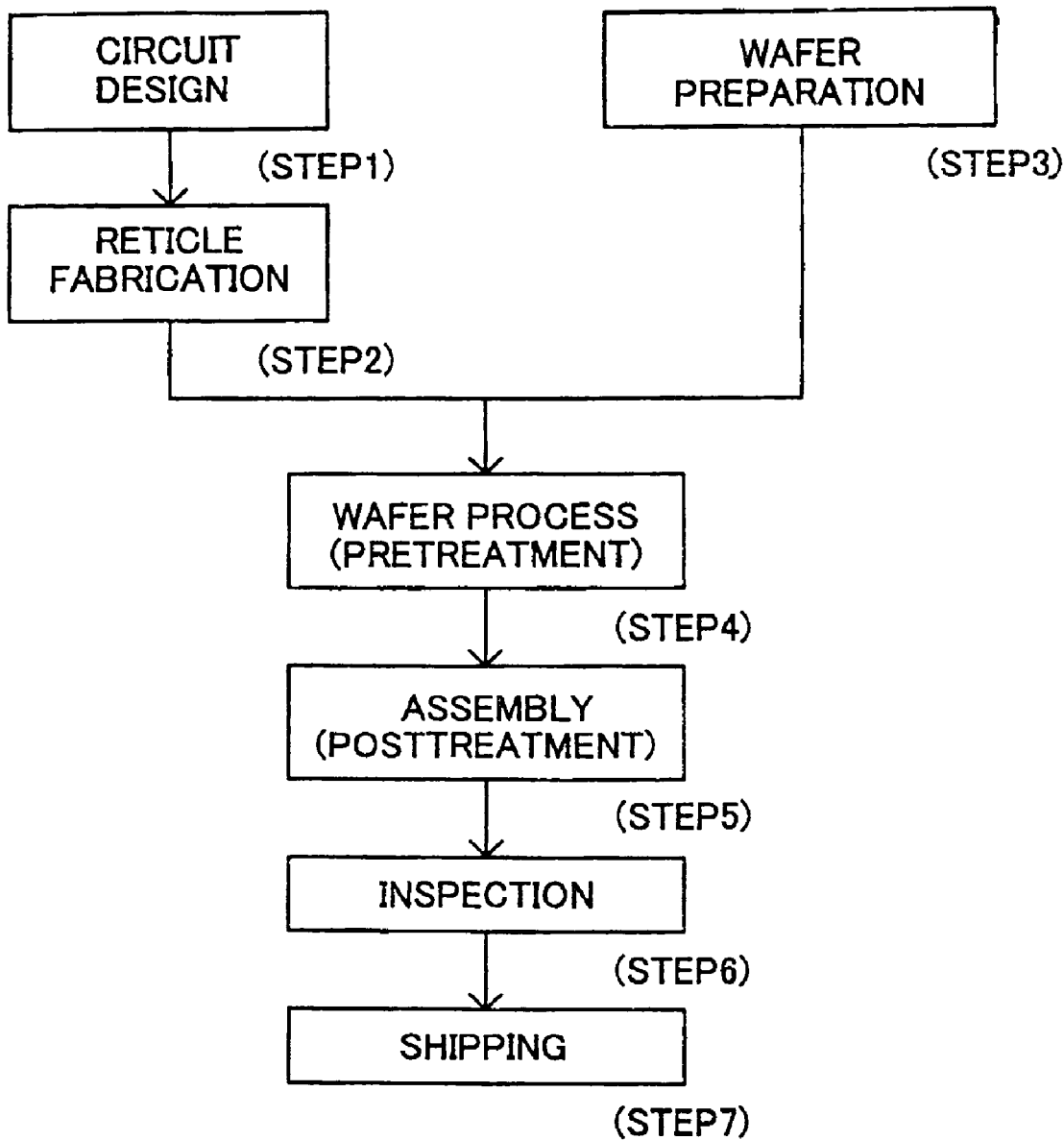
FIG. 8 is a flowchart for explaining a method for fabricating devices (e.g., semiconductor chips, such as IC's LSIs, and the like, LCDs, CCDs, etc.).
Figure 9:
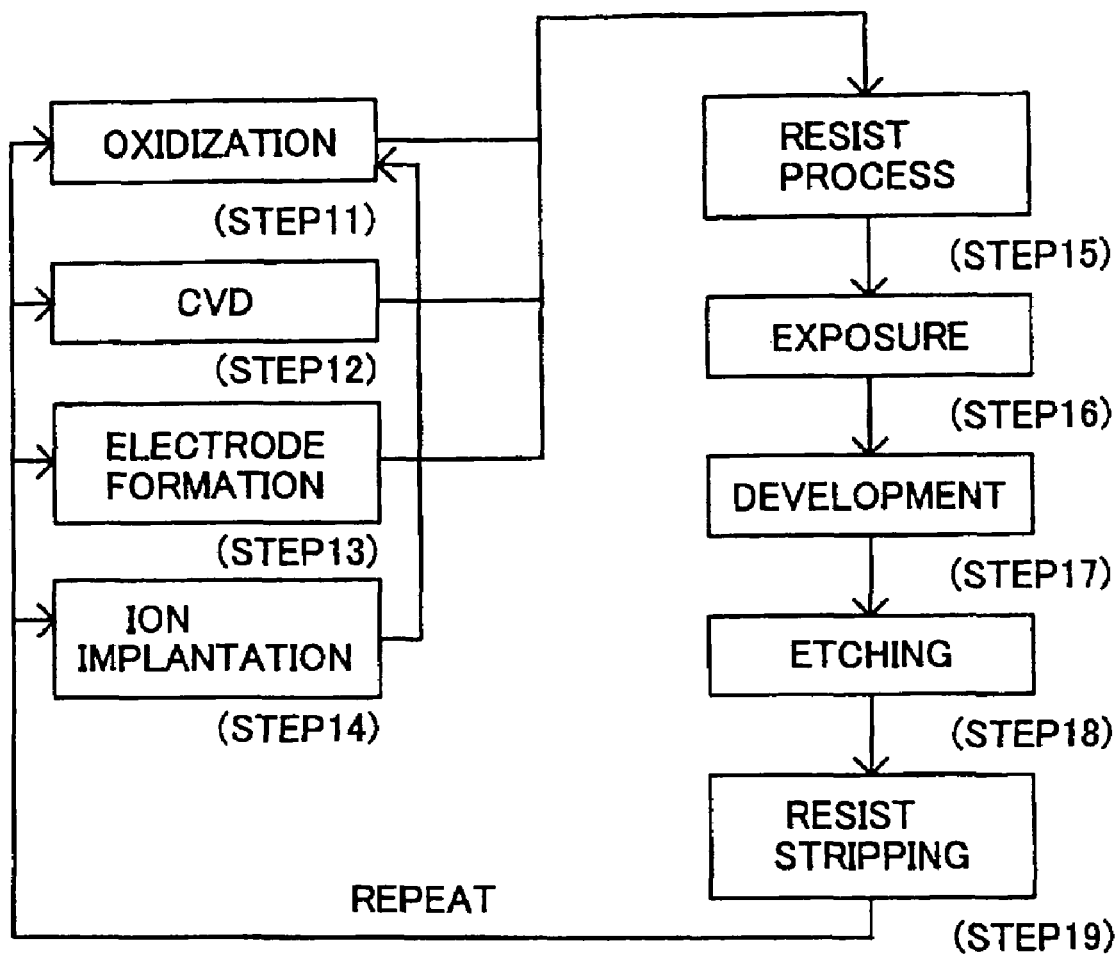
FIG. 9 is a detailed flowchart of a wafer process shown in Step 4 of FIG. 8.

Referring now to FIGS. 8 and 9, a description will be given of an embodiment of a device fabrication method using the above-mentioned exposure apparatus 100. FIG. 8 is a flowchart for explaining how to fabricate devices (i.e., semiconductor chips, such as ICs and LSIs, LCDs, CCDs, and the like). Here, a description will be given of the fabrication of a semiconductor chip, as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 9 is a detailed flowchart of the wafer process shown in Step 4. Step 11 (oxidation) oxidizes the surface of the wafer. Step 12 (CVD) forms an insulating layer on the surface of the wafer. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 100 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than does the conventional one. Thus, the device fabrication method using the exposure apparatus 100, and resultant devices, constitute aspects of the present invention.

Furthermore, the present invention is not limited to these preferred embodiments, and various variations and modifications may be made without departing from the scope of the present invention.

What is claimed is:

1. An exposure apparatus comprising:
 (a) a projection optical system for projecting a pattern of a reticle onto a plate to be exposed, via a liquid that is filled in a space between the projection optical system and the plate, the projection optical system including a plurality of lenses;
 (b) a supply pipe for supplying the liquid to the space between a final surface in the projection optical system and the plate;
 (c) a recovery pipe for removing the liquid from the space between the final surface in the projection optical system and the plate; and
 (d) a measuring apparatus for measuring a refractive index of the liquid, wherein said measuring apparatus comprises:
  (i) a cell for accommodating the liquid and transmitting light, wherein the cell is connected to the recovery pipe, and is disposed apart from the space between the final surface in the projection optical system and the plate, and the cell has an accommodating part and a plurality of openings, and each of the openings is connected to the recovery pipe, so that the liquid is recovered through the accommodating part of the cell from the space between the final surface in the projection optical space and the plate;
  (ii) a detector for detecting an incident position of the light refracted by the liquid in the cell, wherein the light is emitted from a light source and is exposure light used for exposure of the plate,
  (iii) a beam splitter for splitting the light from the light source; and
  (iv) a spatial filter arranged between the beam splitter and the cell.

2. The exposure apparatus according to claim 1, further comprising an optical Fourier transforming element, provided between the cell and the detector, for transforming a change of a refracting angle of the light by the liquid into a change of the incident position detected by the detector.

3. An exposure method comprising the steps of:
 calculating a change of a refractive index of the liquid using the exposure apparatus according to claim 1;
 adjusting at least one of an aberration of a projection optical system and a temperature or consistency of liquid based on a calculated change of the refractive index, so as to cancel the change of the refractive index when the change of the refractive index is less than a predetermined range, wherein said adjusting step reports an error when the change of the refractive index is greater than the predetermined range; and
 exposing a plate using the projection optical system and the liquid, after said adjusting step.

4. A device fabrication method comprising the steps of:
 exposing a plate to be exposed using the exposure apparatus according to claim 1; and
 performing a development process for the plate exposed in said exposing step.

* * * * *